(12) United States Patent
Yeh et al.

(10) Patent No.: US 11,894,320 B2
(45) Date of Patent: Feb. 6, 2024

(54) SEMICONDUCTOR DEVICE PACKAGE WITH STRESS REDUCTION DESIGN AND METHOD OF FORMING THE SAME

(71) Applicant: TAIWAN SEMICONDUCTOR MANUFACTURING COMPANY, LTD., Hsinchu (TW)

(72) Inventors: Shu-Shen Yeh, Taoyuan (TW); Chin-Hua Wang, New Taipei (TW); Po-Chen Lai, Hsinchu County (TW); Po-Yao Lin, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 227 days.

(21) Appl. No.: 17/460,668

(22) Filed: Aug. 30, 2021

(65) Prior Publication Data

US 2023/0067690 A1 Mar. 2, 2023

(51) Int. Cl.
| H01L 23/00 | (2006.01) |
| H01L 21/52 | (2006.01) |
| H01L 23/16 | (2006.01) |
| H01L 23/053 | (2006.01) |

(52) U.S. Cl.
CPC ............ *H01L 23/562* (2013.01); *H01L 21/52* (2013.01); *H01L 23/053* (2013.01); *H01L 23/16* (2013.01)

(58) Field of Classification Search
CPC ..... H01L 23/562; H01L 21/52; H01L 23/053; H01L 23/16
USPC ........................................................ 257/678
See application file for complete search history.

(56) References Cited

U.S. PATENT DOCUMENTS

2004/0150118 A1* 8/2004 Honda ................... H01L 24/28
257/E21.503

* cited by examiner

*Primary Examiner* — Quoc D Hoang
(74) *Attorney, Agent, or Firm* — Birch, Stewart, Kolasch & Birch, LLP

(57) ABSTRACT

A semiconductor device package and a method of forming the same are provided. The semiconductor device package includes a substrate, a semiconductor device, a ring structure, a lid structure, and an adhesive member. The semiconductor device is disposed over the substrate. The ring structure is disposed over the substrate and surrounds the semiconductor device. The lid structure is disposed over the ring structure and extends across the semiconductor device. The adhesive member is disposed in a gap between the ring structure and the semiconductor device and attached to the lid structure and the substrate.

20 Claims, 12 Drawing Sheets

SEMICONDUCTOR DEVICE PACKAGE WITH STRESS REDUCTION DESIGN AND METHOD OF FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules (MCM), for example, or in other types of packaging.

One smaller type of packaging for semiconductors is a flip chip chip-scale package (FcCSP), in which a semiconductor die is placed upside-down on a substrate and bonded to the substrate using bumps. The substrate has wiring routed to connect the bumps on the die to contact pads on the substrate that have a larger footprint. An array of solder balls is formed on the opposite side of the substrate and is used to electrically connect the packaged die to an end application.

Although existing packaging structures and methods for fabricating package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
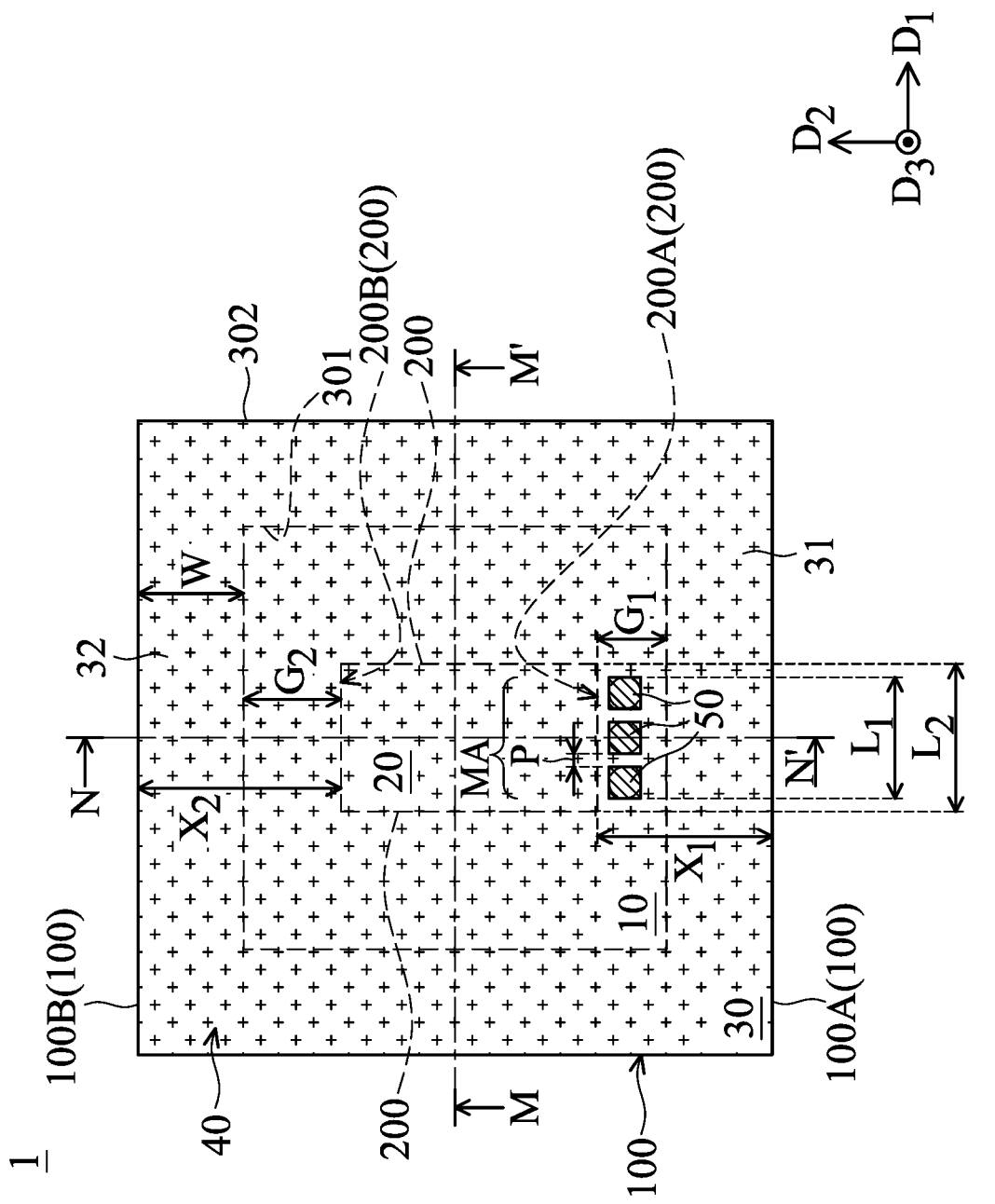
FIG. 1 is a schematic top view of a semiconductor device package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

A semiconductor device package and the method for forming the same are provided in accordance with various embodiments of the present disclosure. Some variations of some embodiments are discussed. Throughout the various views and illustrative embodiments, like reference numbers are used to designate like elements. In some embodiments, a semiconductor device package includes an eccentric semiconductor device (i.e., it is arranged eccentrically with respect to the package substrate), which will cause greater stress on the adhesive layers used in the package and adversely affect the reliability of the package. To address this, one or more stress reduction members (e.g., adhesive members) are provided adjacent to the eccentric semiconductor device to reduce the stress on the adhesive layers, which are described in detail below.

Embodiments may be described with respect to a specific context, namely a chip scale package (CSP), particularly flip chip CSP (FcCSP). Other embodiments may also be applied, however, to other packaging techniques, such as flip chip ball grid array (FcBGA) packages and other packaging techniques, such as with an interposer or other active chip in a two and a half dimensional integrated circuit (2.5DIC) structure or a three dimensional IC (3DIC) structure. Although method embodiments may be discussed below as being performed in a particular order, other method embodiments contemplate steps that are performed in any logical order. Further, like reference numbers or indicators refer to like components.

Figure 2A:
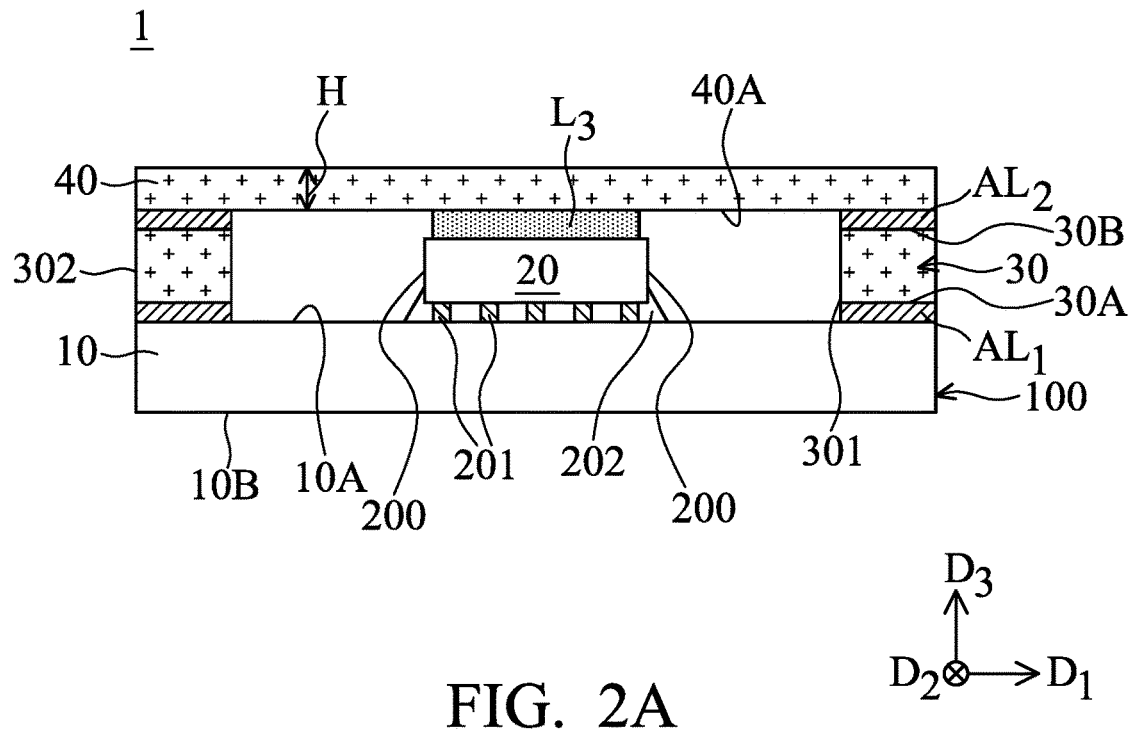
FIG. 2A is a schematic cross-sectional view of the semiconductor device package taken along a line M-M' in FIG. 1, in accordance with some embodiments.
Figure 2B:
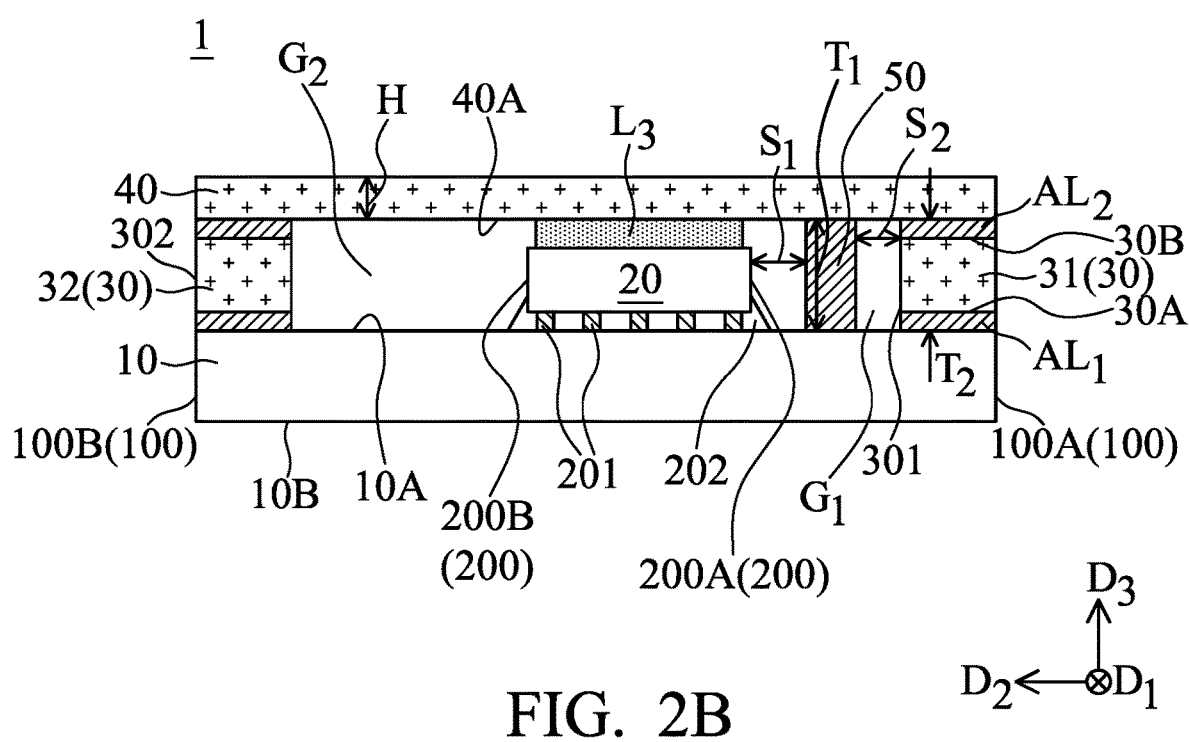
FIG. 2B is a schematic cross-sectional view of the semiconductor device package taken along a line N-N' in FIG. 1, in accordance with some embodiments.

FIG. 1 is a schematic top view of a semiconductor device package 1, in accordance with some embodiments. FIG. 2A is a schematic cross-sectional view of the semiconductor device package 1 taken along a line M-M' in FIG. 1, and FIG. 2B is a schematic cross-sectional view of the semiconductor device package 1 taken along a line N-N' in FIG. 1. Referring to FIG. 1, FIG. 2A, and FIG. 2B, the semiconductor device package 1 includes a substrate 10, a semiconductor device 20, a ring structure 30, a lid structure 40, and multiple adhesive members 50. Additional features can be added to the semiconductor device package 1, and/or some of the features described below can be replaced or eliminated in other embodiments.

The substrate 10 may be used to provide electrical connection between semiconductor device(s) (which will be described later) packaged in the semiconductor device package 1 and an external electronic device (not shown). In some embodiments, the substrate 10 is a semiconductor substrate. By way of example, the material of the substrate 10 may include elementary semiconductor such as silicon or germanium; a compound semiconductor such as silicon germanium, silicon carbide, gallium arsenic, gallium phosphide, indium phosphide or indium arsenide; or combinations thereof. In some embodiments, the substrate 10 is a silicon-on-insulator (SOI) substrate, a germanium-on-insulator (GOI) substrate, or the like. In some embodiments, the substrate 10 is an interposer substrate, a package substrate, or the like. The package substrate may include a printed circuit board (PCB), a ceramic substrate, or another suitable package substrate.

In some embodiments, the substrate 10 has various device elements (not shown for simplicity). Examples of device elements that are formed in or on the substrate 10 may include transistors (e.g., metal oxide semiconductor field effect transistors (MOSFET), complementary metal oxide semiconductor (CMOS) transistors, bipolar junction transistors (BJT), high voltage transistors, high-frequency transistors, p-passage and/or n-passage field-effect transistors (PFETs/NFETs), etc.), diodes, resistors, capacitors, inductors, and/or other applicable device elements. Various processes can be performed to form the device elements, such as deposition, etching, implantation, photolithography, annealing, and/or other suitable processes. The substrate 10 may further have one or more circuit layers used to electrically connect the device elements with the semiconductor device(s) that is subsequently attached. The substrate 10 generally has a rectangular or square shape in a top view, but the disclosure is not limited thereto.

In some embodiments, one semiconductor device 20 is disposed over a first surface 10A (e.g., the upper surface shown) of the substrate 10, although more semiconductor devices may also be used. In some embodiments, the semiconductor device 20 is a functional integrated circuit (IC) die such as a semiconductor die, an electronic die, a Micro-Electro Mechanical Systems (MEMS) die, or a combination thereof. The functional IC die may include one or more application processors, logic circuits, memory devices, power management integrated circuits, analog circuits, digital circuits, mixed signal circuits, one or more other suitable functional integrated circuits, or a combination thereof, depending on actual needs. In some alternative embodiments, the semiconductor device 20 is a package module that has one or more semiconductor dies and an interposer substrate carrying these semiconductor dies. These structures of the semiconductor device 20 are well known in the art and therefore not described herein. The semiconductor device 20 can be fabricated by various processes such as deposition, etching, implantation, photolithography, annealing, and/or other suitable processes.

After being fabricated, the semiconductor device 20 may be placed in a desired location above the substrate 10 using, for example, a pick-and-place tool. In some embodiments, the semiconductor device 20 is placed eccentrically with respect to the substrate 10 depending on design requirements (such as consideration of space arrangements). For example, as shown in FIG. 1, in a top view, the semiconductor device 20 is placed closer to the lower edge 100A of the substrate 10 and farther away from the upper edge 100B of the substrate 10 (i.e., the distance $X_1$ between the semiconductor device 20 and the lower edge 100A is shorter than the distance $X_2$ between the semiconductor device 20 and the upper edge 100B). Therefore, the semiconductor device 20 may also be referred to as an eccentric semiconductor device herein.

In some embodiments, the semiconductor device 20 is mounted on the substrate 10 through flip-chip bonding, although other suitable bonding techniques may also be used. As shown in FIG. 2A and FIG. 2B, the semiconductor device 20 is placed so that its active surface (e.g., the lower surface shown) faces the first surface 10A of the substrate 10, and then is bonded onto the contact pads (not shown for simplicity) exposed at the first surface 10A via electrical connectors 201. The electrical connectors 201 are used for electrically interconnecting the semiconductor device 20 with the substrate 10. The electrical connectors 201 may include conductive pillars, solder balls, controlled collapse chip connection (C4) bumps, micro bumps, one or more other suitable bonding structures, or a combination thereof.

In some embodiments, the electrical connectors 201 are made of or include a metal material, such as copper, aluminum, gold, nickel, silver, palladium, or the like, or a combination thereof. The electrical connectors 201 may be formed using an electroplating process, an electroless plating process, a placement process, a printing process, a physical vapor deposition (PVD) process, a chemical vapor deposition (CVD) process, a photolithography process, one or more other applicable processes, or a combination thereof. In some other embodiments, the electrical connectors 201 are made of or include a tin-containing material. The tin-containing material may further include copper, silver, gold, aluminum, lead, one or more other suitable materials, or a combination thereof. In some other embodiments, the electrical connectors 201 are lead-free. A reflow process may be performed in order to shape the tin-containing material into the desired bump or ball shapes.

In some embodiments, an underfill layer 202 is also formed to surround and protect the electrical connectors 201, and enhances the connection between the semiconductor device 20 and the substrate 10, as shown in FIG. 2A and FIG. 2B. The underfill layer 202 may be made of or include an insulating material such as an underfill material. The underfill material may include an epoxy, a resin, a filler material, a stress release agent (SRA), an adhesion promoter, another suitable material, or a combination thereof.

In some embodiments, an underfill material in liquid state is dispensed into a gap between the semiconductor device 20 and the substrate 10 to reinforce the strength of the electrical connectors 201 and therefore the overall package structure. After the dispensing, the underfill material is cured to form the underfill layer 202. In some other embodiments, the underfill layer 202 is not formed.

In some embodiments, the semiconductor device package 1 also includes electrical connectors, such as solder balls (not shown for simplicity), formed over a second surface 10B (e.g., the lower surface shown) of the substrate 10. The solder balls are electrically connected to the electrical connectors 201 through the circuit layer(s) of the substrate 10. The solder balls enable an electrical connection to be made between the semiconductor device package 1 and an external electronic device such as a PCB (not shown).

In some embodiments, the ring structure 30 is disposed over the first surface 10A of the substrate 10, and is arranged along the periphery of the substrate 10. The ring structure 30 generally has a rectangular or square ring shape in a top view, depending on the shape of the substrate 10. For example, the inner edge 301 of the ring structure 30 may be adjacent to and surround sidewalls 200 of the semiconductor device 20, and the outer edge 302 may be substantially aligned with the edge 100 of the substrate 10, as shown in FIG. 1. Moreover, the ring structure 30 is basically a flat structure, and has a bottom surface 30A and a top surface 30B opposite to the bottom surface 30A. The bottom surface 30A faces the first surface 10A. The ring structure 30 may be configured as a stiffener ring, and used to constrain the substrate 10 to alleviate its warpage and/or to enhance robustness of the substrate 10. In some embodiments, the material of the ring structure 30 may include metal such as copper, stainless steel, stainless steel/Ni, or the like, but is not limited thereto.

In some embodiments, the entire ring structure 30 has a uniform width W in a top view, as shown in FIG. 1. However, different parts of the ring structure 30 may have different widths for better structural strength, in some other embodiments (for example, see FIGS. 5A to 5E and FIG. 6).

In cases where the semiconductor device 20 is arranged closer to the lower edge 100A and farther away from the upper edge 100B of the substrate 10 as shown in FIG. 1 and FIG. 2B, a gap $G_1$ is formed between a sidewall 200A of the semiconductor device 20 and a ring part 31 of the ring structure 30 adjacent to the lower edge 100A, and a gap $G_2$ is formed between a sidewall 200B of the semiconductor device 20 and a ring part 32 of the ring structure 30 adjacent to the upper edge 100B. The sidewall 200A may be parallel to the ring part 31, and the sidewall 200B may be parallel to the ring part 32. The gap $G_1$ is smaller than the gap $G_2$. As discussed above, such (eccentric) design is based on the consideration of space arrangements.

In some embodiments, an adhesive layer $AL_1$ is interposed between the bottom surface 30A of the ring structure 30 and the first surface 10A of the substrate 10. The adhesive layer $AL_1$ may be configured to bond the ring structure 30 to the substrate 10. The adhesive layer $AL_1$ may be applied to the first surface 101 and/or the bottom surface 30A before installing the ring structure 30 on the substrate 10. Examples of the material for the adhesive layer $AL_1$ may include organic adhesive material such as epoxy, polyimide (PI), polybenzoxazole (PBO), benzo-cyclo-butene (BCB), but are not limited thereto.

In some embodiments, the lid structure 40 is disposed over the top surface 30B of the ring structure 30, and extends across the underlying semiconductor device 20. The lid structure 40 generally has a rectangular or square ring shape in a top view, depending on the shape of the substrate 10 (or the ring structure 30). In some embodiments, the planar size of the lid structure 40 is substantially equal to the planar size of the substrate 10, although the planar size of the lid structure 40 may be larger or smaller than the planar size of the substrate 10. The lid structure 40 is basically flat. For example, the entire lid structure 40 has a uniform height H in a vertical direction $D_3$ perpendicular to the first surface 10A of the substrate 10.

In some embodiments, the lid structure 40 is bonded to the ring structure 30 via an adhesive layer $AL_2$ interposed between the lid structure 40 and the top surface 30B of the ring structure 30. The materials and formation method of the adhesive layer $AL_2$ may be the same as or similar to those of the adhesive layer ALL The lid structure 40 and the ring structure 30 are configured as a shielding element for sealing and protecting the semiconductor device 20 on the substrate 10. In some embodiments, the lid structure 40 and the ring structure 30 are made of or include the same material, although they may be made of or include different materials. In some other embodiments, the lid structure 40 and the ring structure 30 are integrally formed in one piece, and the adhesive layer $AL_2$ is omitted.

In some embodiments, a thermal interface material (TIM) layer $L_3$ is interposed between the lid structure 40 and the semiconductor device 20. The thermal interface material layer $L_3$ may be a thermally conductive and electrically insulative material, such as an epoxy, an epoxy mixed with a metal like silver or gold, a thermal grease, the like, or a combination thereof. As such, the lid structure 40 is thermally coupled to the semiconductor device 20 via the interface material layer $L_3$, and the lid structure 40 may also be configured as a heat spreader for dispersing heat generated from the semiconductor device 20. The interface material layer $L_3$ may be applied to the upper surface of the semiconductor device 20 and/or the bottom surface 40A the lid structure 40 before placing the lid structure 40 over the semiconductor device 20.

It should be understood that the above-mentioned various components and substrate materials used in the semiconductor device package 1 may have different coefficient of thermal expansions (CTEs). Hence, when the package undergoes thermal cycling during package assembly, reliability testing, or field operation, the components and substrate materials may expand at different rates, causing the package tends to warp (although the ring structure 30 has been provided to alleviate warpage). In cases where the eccentric semiconductor device 20 is eccentrically arranged with respect to the substrate 10, more serious deformation of the package occurs on the eccentric side of the semiconductor device 20, thereby causing greater stress on portions of the adhesive layer(s) near the eccentric side and increasing the risk of delamination. For example, in the embodiments of FIG. 2B, the semiconductor device 20 is eccentric to the right, and hence the portions (circled by dotted lines) of the adhesive layer $AL_1$ and/or the adhesive layer $AL_2$ adjacent to the eccentric side of the semiconductor device 20 will be subjected greater stress during thermal cycling. As a result, the risk of delamination occurring at these portions of the adhesive layer $AL_1$ and/or the adhesive layer $AL_2$ is increased, and the reliability of the package decreases.

A stress reduction design is provided in the semiconductor device package 1 to solve the above-mentioned problems in accordance with some embodiments of the disclosure. Various designs or arrangements related to the stress reduction design will be described below.

In some embodiments, as shown in FIG. 1 and FIG. 2B, several adhesive members 50 are provided in the smaller gap $G_1$ between the sidewall 200A of the eccentric semiconductor device 20 and the ring part 31 of the ring structure 30. Each of the adhesive members 50 extends from the first surface 10A of the substrate 10 to the bottom surface 40A of the lid structure 40 to connect the lid structure 40 to the substrate 10 (therefore, the thickness $T_1$ of the adhesive member 50 in the vertical direction D3 is substantially equal to the combined thickness $T_2$ of the adhesive layer $AL_1$, the ring structure 30 and the adhesive layer $AL_2$ in the vertical direction D3, i.e. $T_1=T_2$).

The adhesive members 50 may include an adhesive material, and are directly attached to the lid structure 40 and the first surface 10A of the substrate 10, in some embodiments. The adhesive material may include organic adhesive material such as epoxy, polyimide (PI), polybenzoxazole (PBO), benzo-cyclo-butene (BCB), similar to the adhesive layers $AL_1$ and $AL_2$, although other suitable adhesive materials may also be used. In some embodiments, an adhesive material in a liquid state may be dispensed (e.g., by a dispensing tool, not shown) into the gap $G_1$, and then cured to form the adhesive members 50. Each of the adhesive members 50 may have a substantial square with right or rounded corners, rectangular with right or rounded corners, circular (as shown by the dotted line in FIG. 1), or other suitable shapes in a top view.

In some embodiments, the adhesive members 50 are separated from each other and arranged in a first direction $D_1$ parallel to the sidewall 200A of the semiconductor device 20, as shown in FIG. 1. In some embodiments, the adhesive members 50 have the substantially same pitch P (in the first direction $D_1$) between adjacent adhesive members 50, but the disclosure is not limited thereto. In the embodiments of FIG. 1, the adhesive members 50 are arranged to correspond to a middle area MA of the sidewall 200A of the semiconductor device 20. The term "middle area" used herein refers to a relatively middle area of the sidewall 200A, which occupies about 50% to about 75% of the total area of the sidewall 200A. As such, the combined length $L_1$ of the adhesive members 50 in the first direction $D_1$ is shorter than the length $L_2$ of the sidewall 200A in the first direction $D_1$.

Many variations and/or modifications can be made to embodiments of the disclosure. For example, FIGS. 3A to 3F are schematic top views showing different arrangements of the adhesive members 50 in accordance with some embodiments (for simplicity, the lid structure 40 of the package is omitted in these drawings).

Figure 3A:
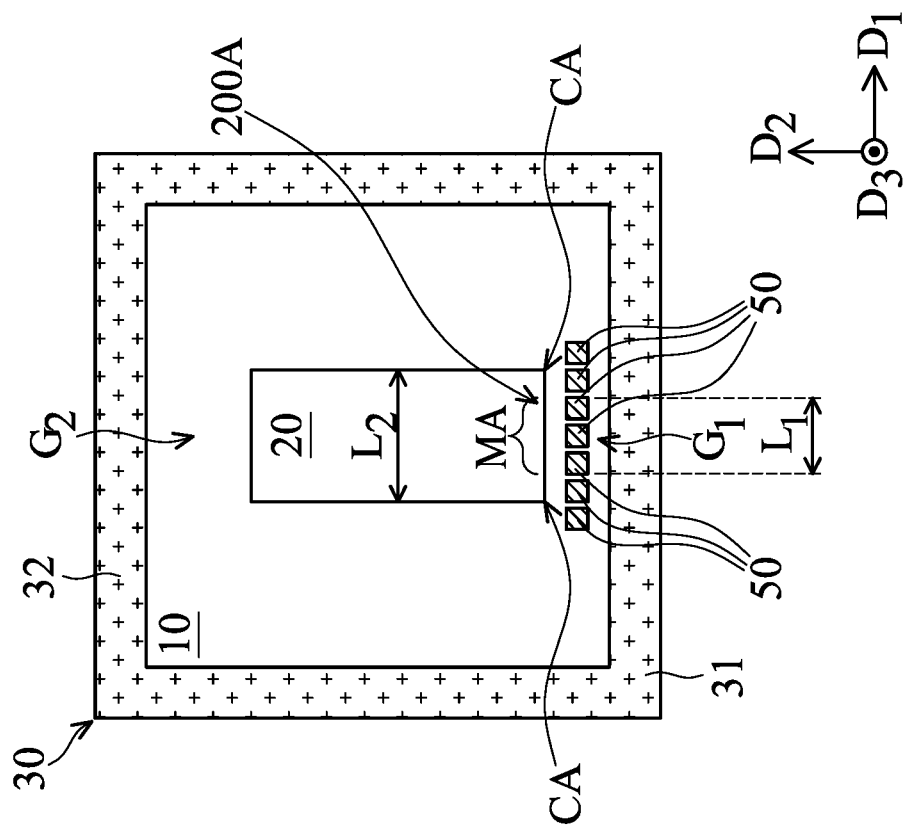
FIG. 3A is a schematic top view illustrating the arrangement of multiple adhesive members, in accordance with some embodiments.
Figure 3B:
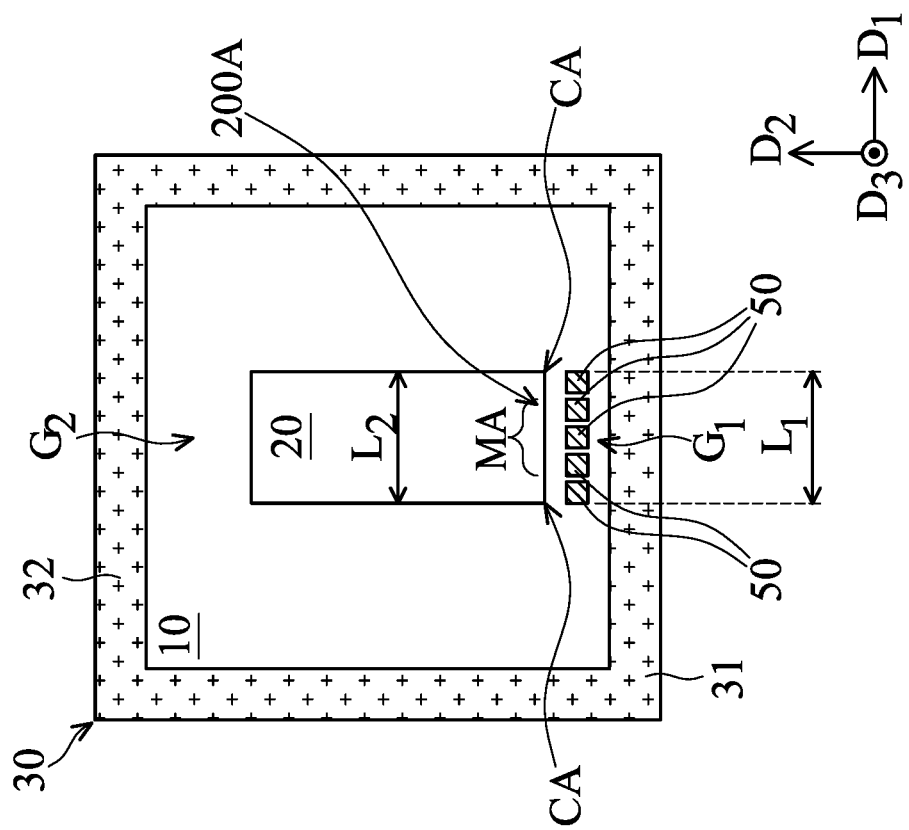
FIG. 3B is a schematic top view illustrating the arrangement of multiple adhesive members, in accordance with some embodiments.

In FIG. 3A, several adhesive members 50 in the gap $G_1$ are arranged in the first direction $D_1$, and are arranged to correspond to both the middle area MA and two corner areas CA (the terms "corner areas" used herein refers to areas corresponding to two corners of the semiconductor device 20 and adjacent to the middle area MA of the sidewall 200A) of the sidewall 200A of the semiconductor device 20. As such, the combined length $L_1$ of the adhesive members 50 in the first direction $D_1$ is substantially equal to (or slightly shorter than) the length $L_2$ of the sidewall 200A in the first direction $D_1$. In FIG. 3B, some of the adhesive members 50 are located beyond the corner areas CA of the sidewall 200A. As such, the combined length $L_1$ of the adhesive members 50 in the first direction $D_1$ is greater than the length $L_2$ of the sidewall 200A in the first direction $D_1$.

Figure 3C:
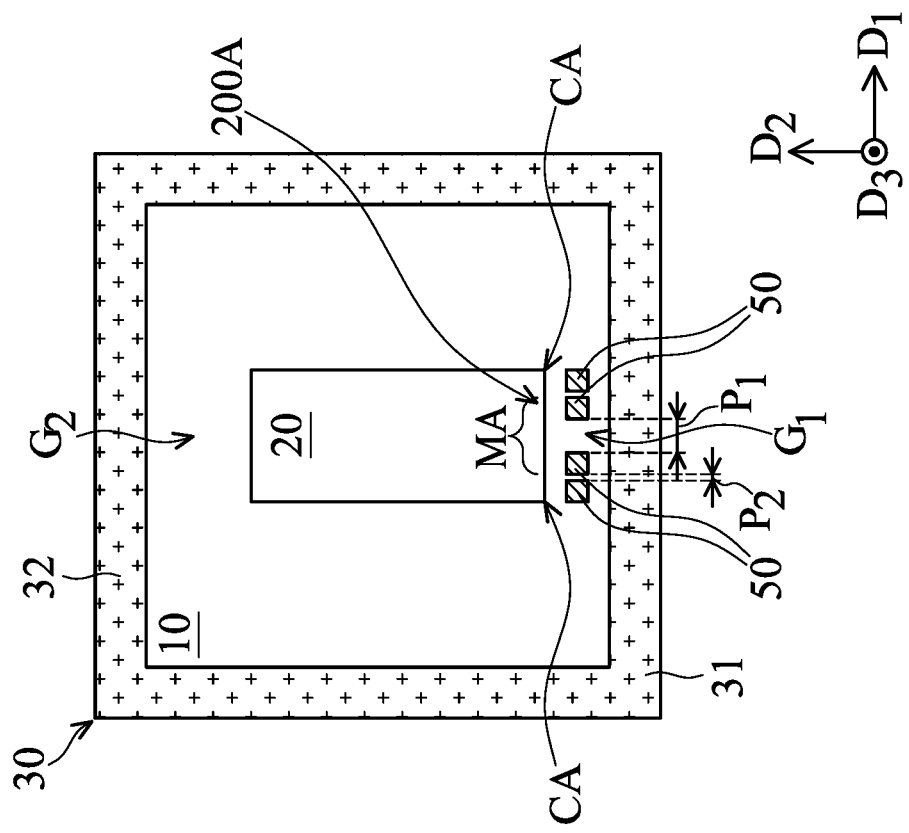
FIG. 3C is a schematic top view illustrating the arrangement of multiple adhesive members, in accordance with some embodiments.
Figure 3D:
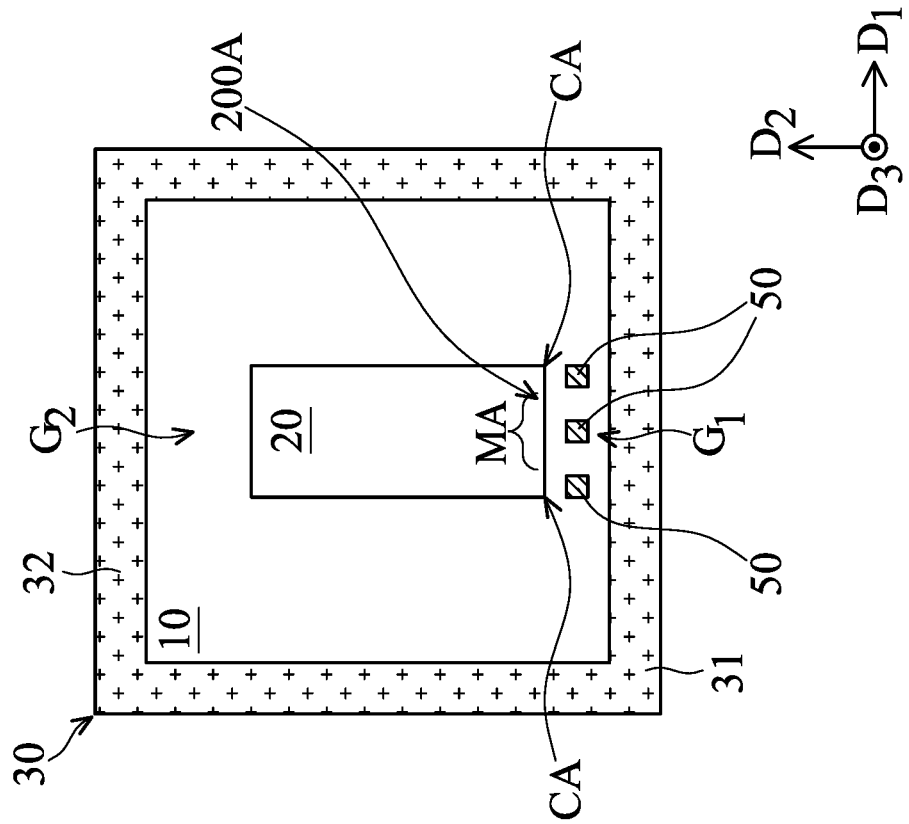
FIG. 3D is a schematic top view illustrating the arrangement of multiple adhesive members, in accordance with some embodiments.
Figure 3E:
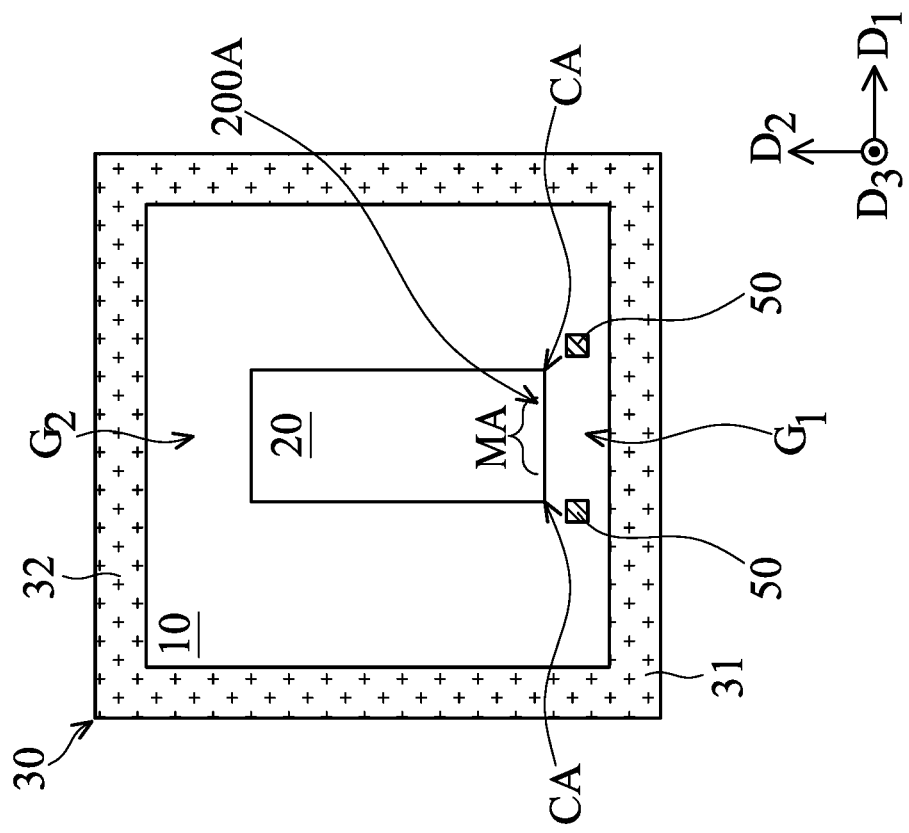
FIG. 3E is a schematic top view illustrating the arrangement of multiple adhesive members, in accordance with some embodiments.
Figure 3F:
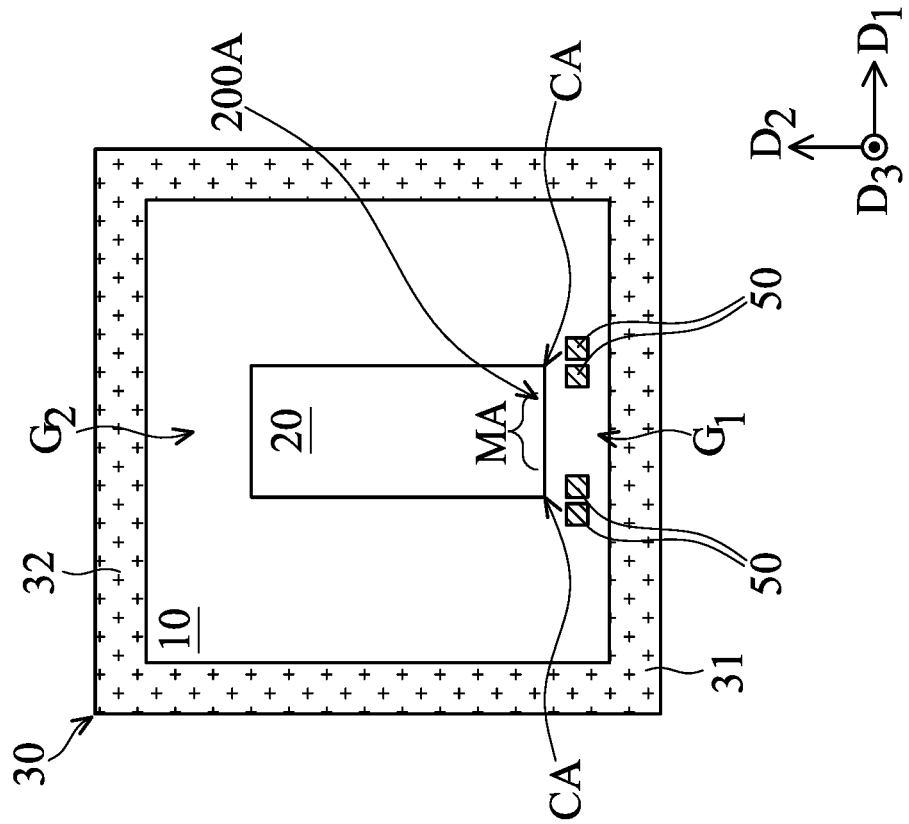
FIG. 3F is a schematic top view illustrating the arrangement of multiple adhesive members, in accordance with some embodiments.

In FIG. 3C, there are three adhesive members 50 provided in the gap $G_1$, and the positions of the adhesive members 50 respectively correspond to the middle area MA and two corner areas CA of the sidewall 200A. In FIG. 3D, the adhesive members 50 are also arranged to correspond to both the middle area MA and two corner areas CA of the sidewall 200A, but there is a larger pitch $P_1$ between adjacent adhesive members 50 corresponding to the middle area MA (the pitch $P_1$ is larger than a pitch $P_2$ between adjacent adhesive members 50 in other positions). In FIG. 3E and FIG. 3F, the adhesive members 50 are arranged to correspond to the two corner areas CA, but not to the middle area MA of the sidewall 200A. The number of adhesive members 50 corresponding to each corner area CA may be one or more.

One of ordinary skill in the art will appreciate that the above arrangement examples of the adhesive members 50 are provided for illustrative purposes, and other suitable arrangements may also be used.

With the above designs, the adhesive members 50 helps to couple the lid structure 40 with the substrate 10 (as well as other components therebetween), thereby reducing stress on the adhesive layer $AL_1$ and/or the adhesive layer $AL_2$ (especially for the portions adjacent to the eccentric side of the semiconductor device 20) caused by the components in the package having various CTEs (i.e., various deformations) during thermal cycling in some embodiments. As a result, the reliability of the package may be improved.

In addition, each of the adhesive members 50 is separated from the semiconductor device 20 and the ring part 31 of the ring structure 30, in accordance with some embodiments.

For example, there is a distance $S_1$ greater than 0 μm between each of the adhesive members 50 and the semiconductor device 20, and there is a distance $S_2$ greater than 0 μm between each of the adhesive members 50 and the ring part 30, in a second direction $D_2$ perpendicular to the first direction $D_1$, as shown in FIG. 2B. The distance $S_1$ may be the same as or different from the distance $S_2$ in various embodiments. This helps to avoid some side effects such as die (device) cracking.

Figure 4A:
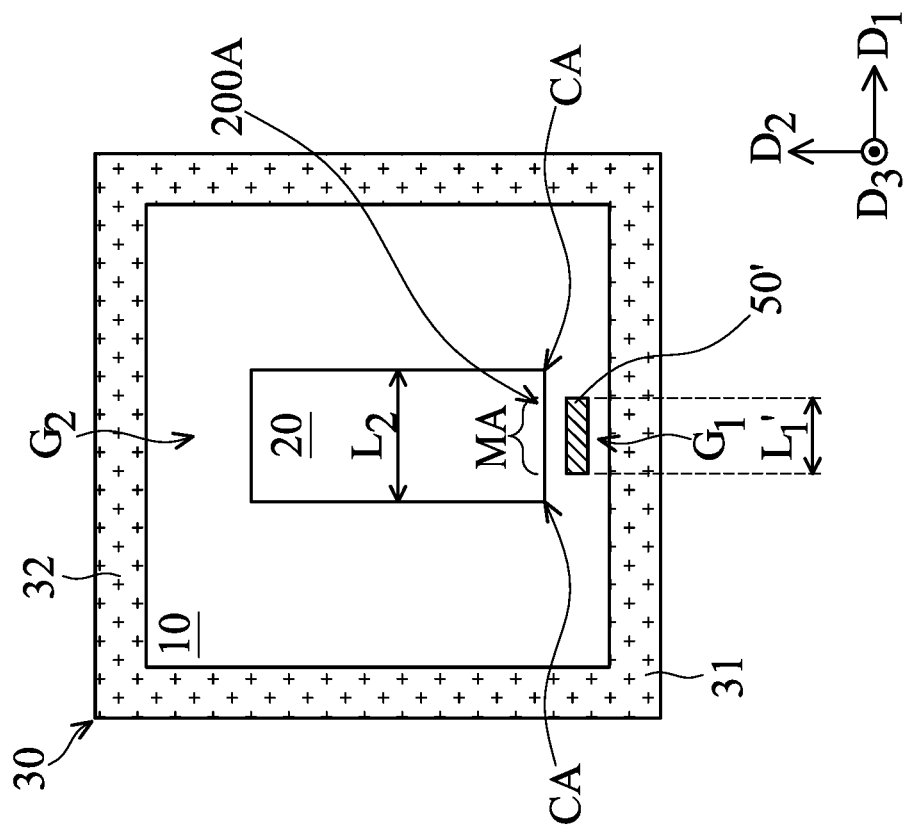
FIG. 4A is a schematic top view illustrating the arrangement of an adhesive member, in accordance with some embodiments.
Figure 4B:
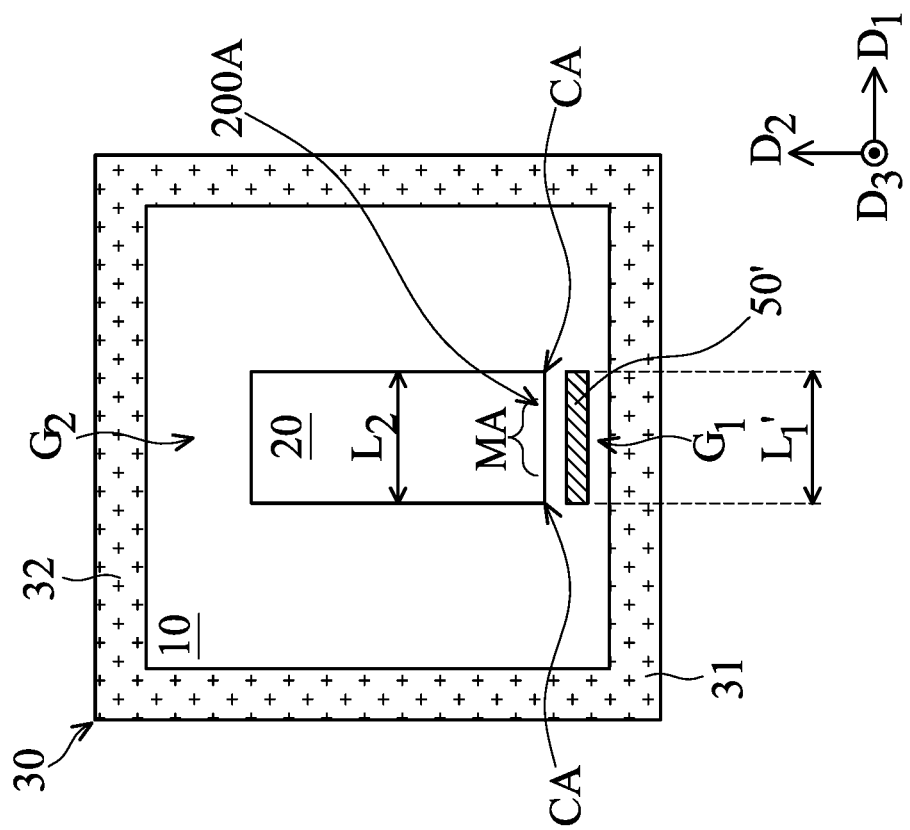
FIG. 4B is a schematic top view illustrating the arrangement of an adhesive member, in accordance with some embodiments.
Figure 5A:
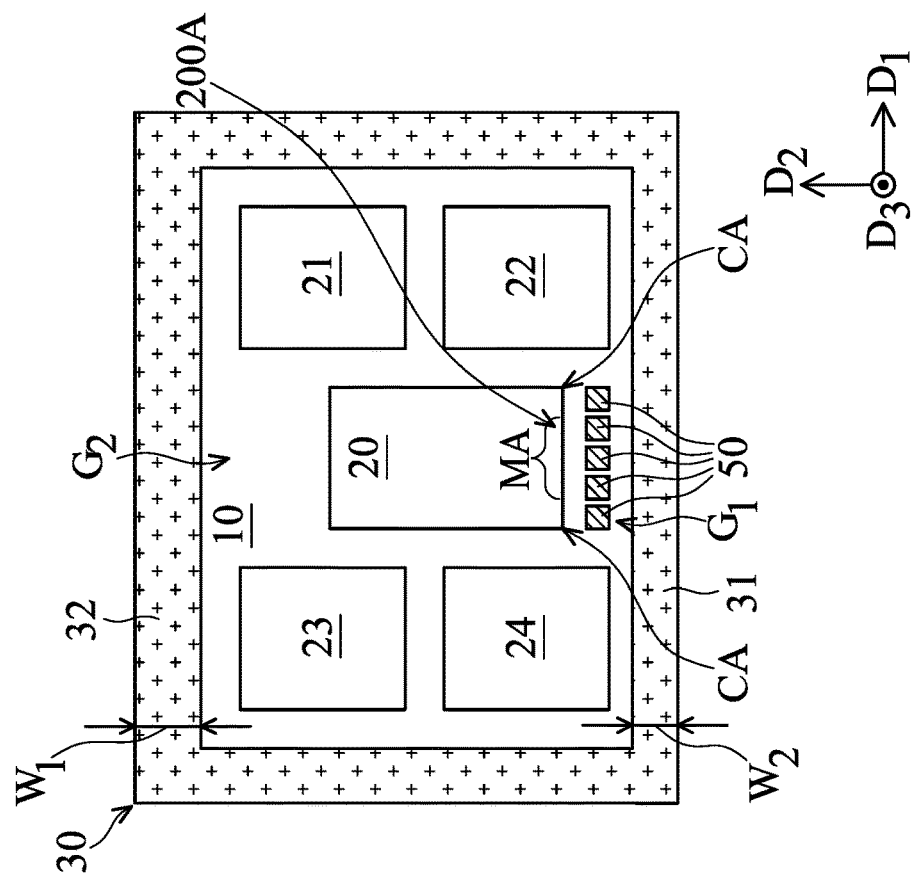
FIG. 5A is a schematic top view illustrating the arrangement of multiple adhesive members, in accordance with some embodiments.
Figure 5B:
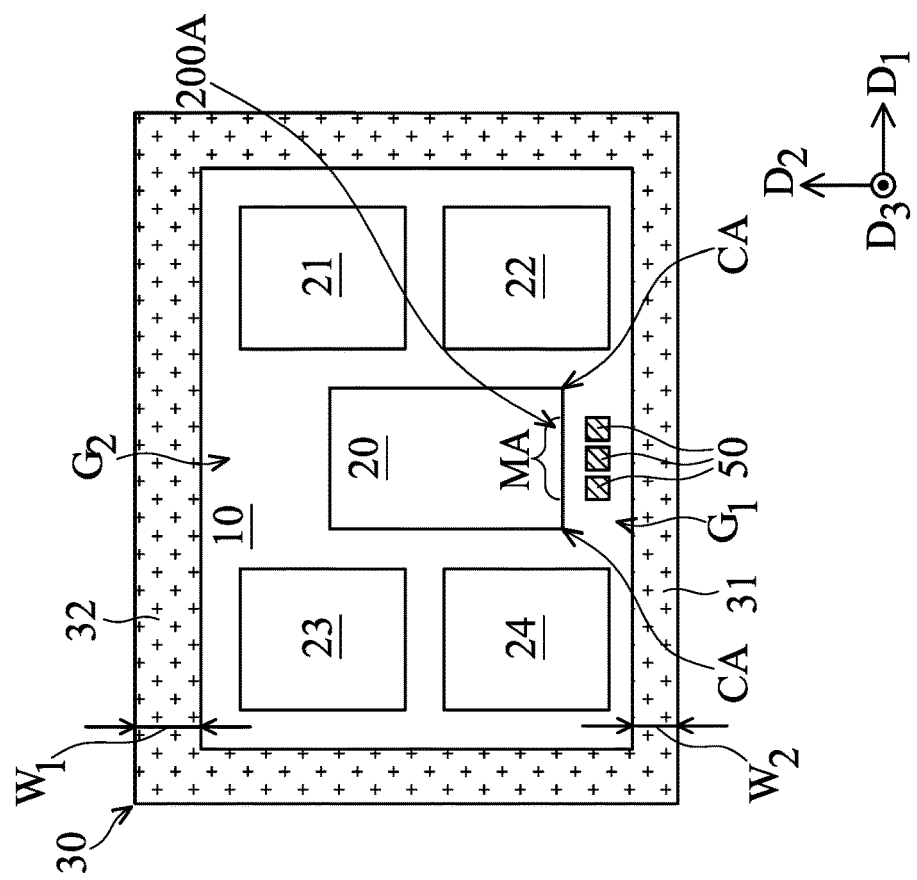
FIG. 5B is a schematic top view illustrating the arrangement of multiple adhesive members, in accordance with some embodiments.
Figure 5C:
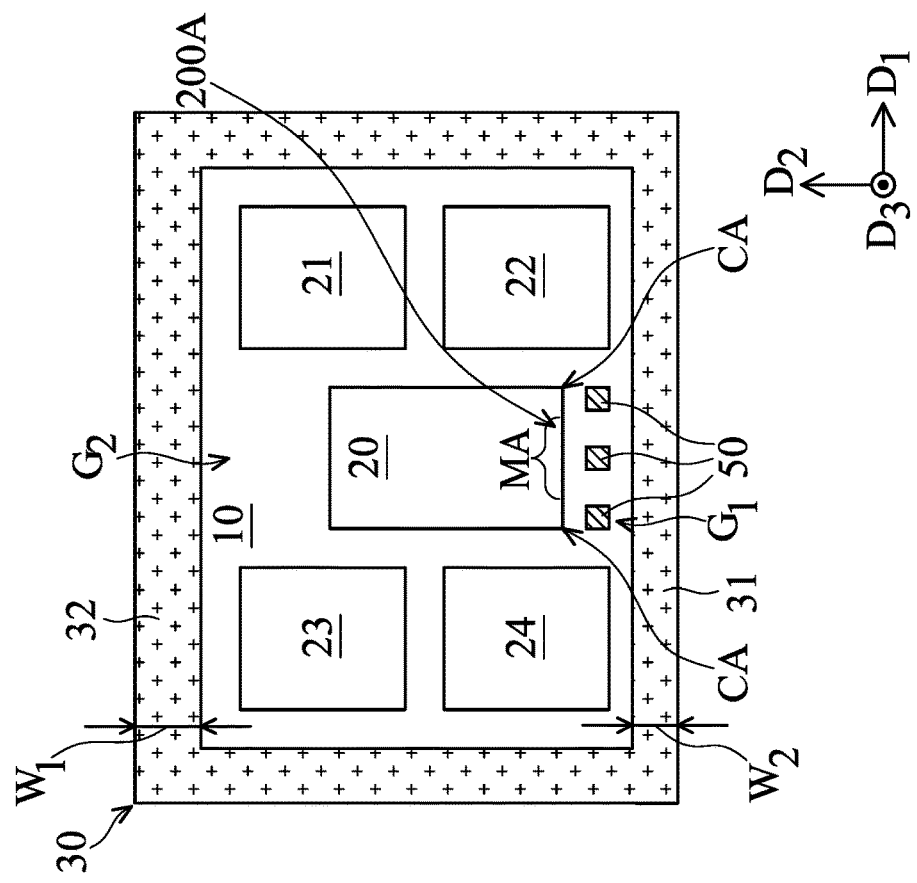
FIG. 5C is a schematic top view illustrating the arrangement of multiple adhesive members, in accordance with some embodiments.
Figure 5D:
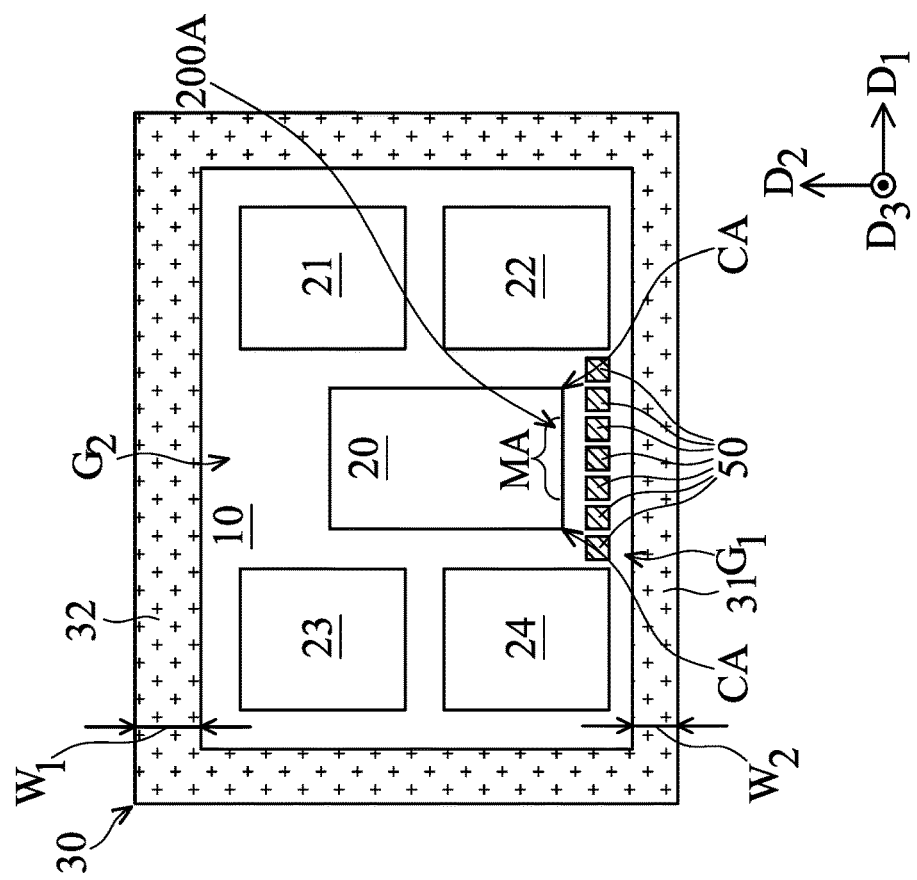
FIG. 5D is a schematic top view illustrating the arrangement of multiple adhesive members, in accordance with some embodiments.
Figure 5E:
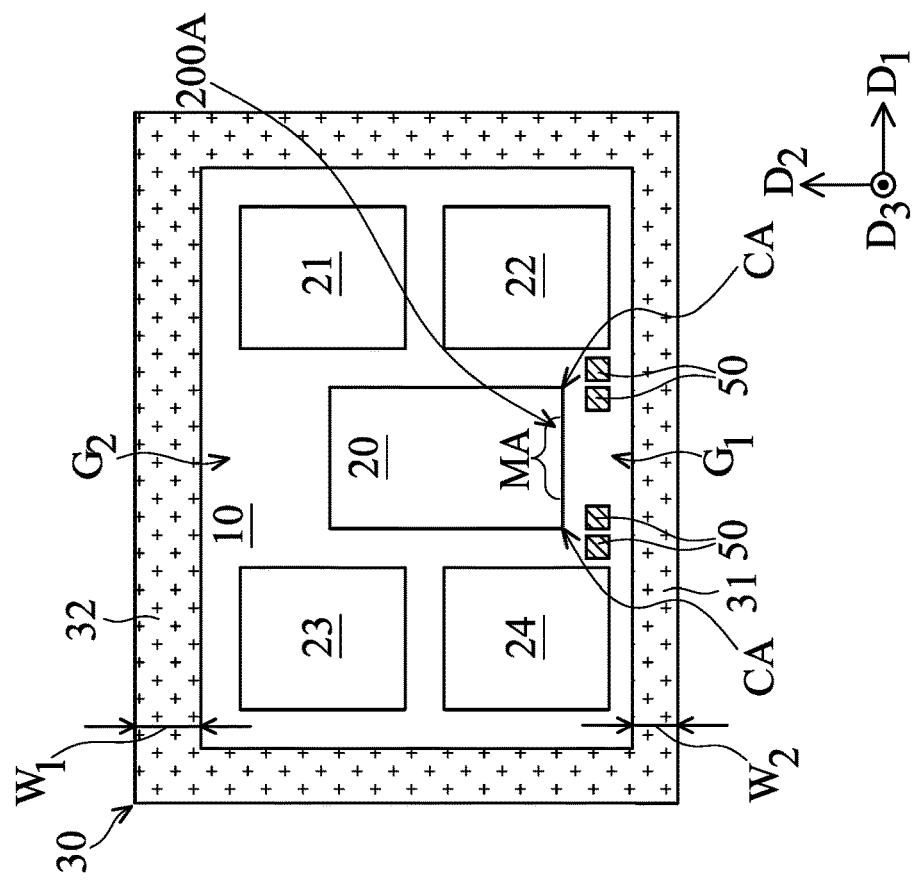
FIG. 5E is a schematic top view illustrating the arrangement of multiple adhesive members, in accordance with some embodiments.
Figure 5F:
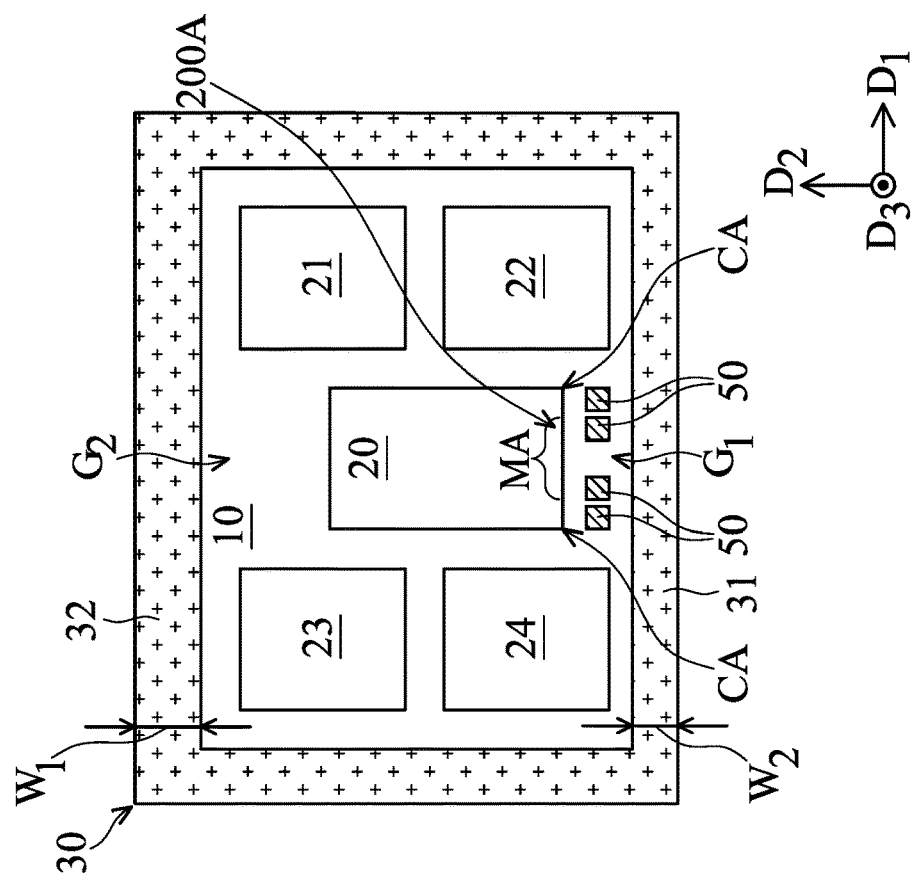
FIG. 5F is a schematic top view illustrating the arrangement of multiple adhesive members, in accordance with some embodiments.
Figure 5G:
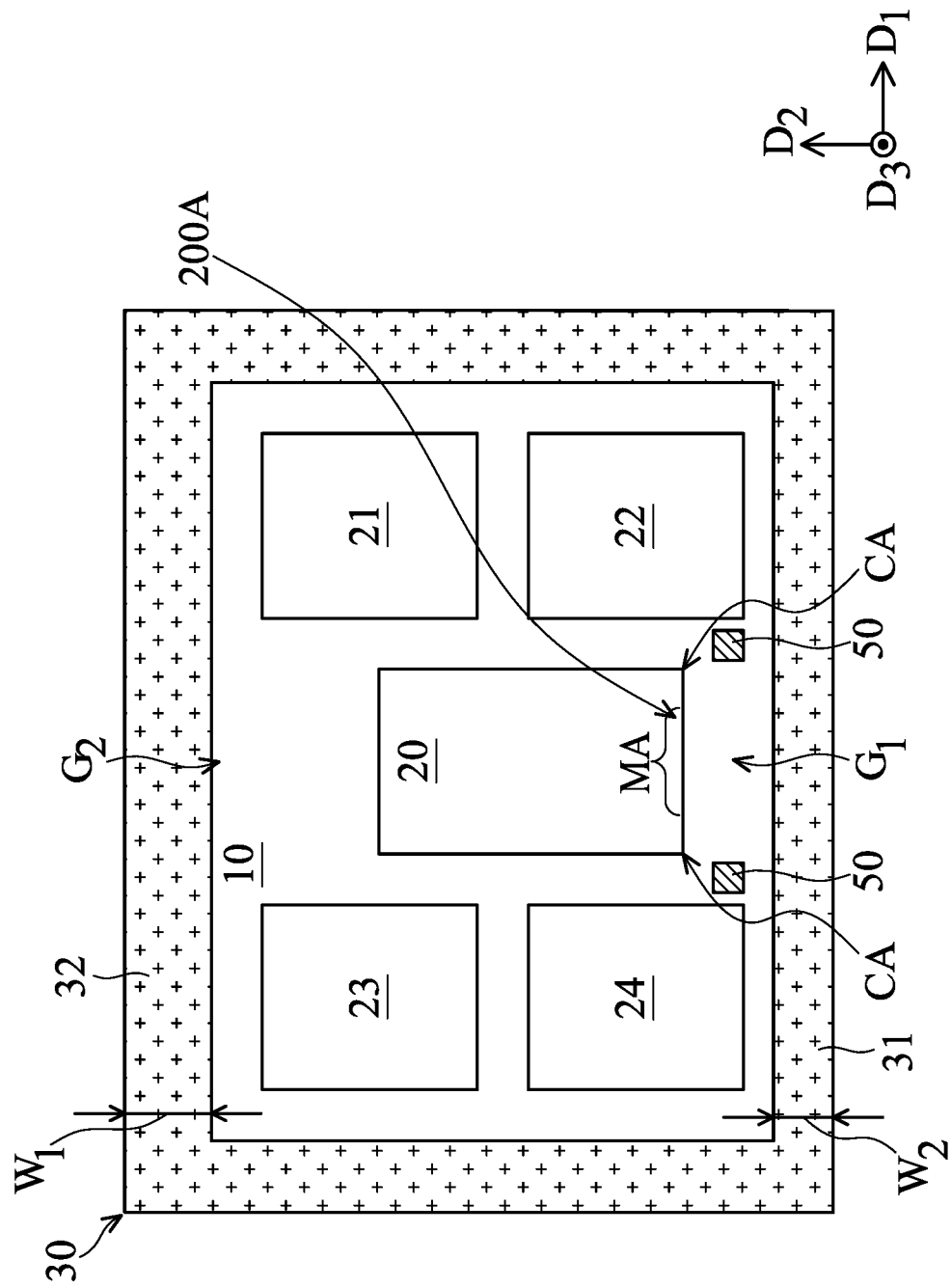
FIG. 5G is a schematic top view illustrating the arrangement of multiple adhesive members, in accordance with some embodiments.

FIG. 4A and FIG. 4B are schematic top views illustrating the arrangements of an adhesive member 50' for replacing multiple adhesive members 50, in accordance with some embodiments. The materials and formation method of the adhesive member 50' may be the same as or similar to those of the adhesive members 50. In FIG. 4A and FIG. 4B, the adhesive member 50' is an elongated structure extending in the first direction $D_1$, and is provided in the smaller gap G1 between the sidewall 200A of the eccentric semiconductor device 20 and the ring part 31 of the ring structure 30. The adhesive member 50' may be arranged to correspond to both the middle area MA and two corner areas CA of the sidewall 200A, as shown in FIG. 4A. As such, the length $L_1'$ of the adhesive member 50' in the first direction $D_1$ is substantially equal to the length $L_2$ of the sidewall 200A in the first direction $D_1$. Alternatively, the adhesive member 50' may be arranged to correspond only to the middle area MA of the sidewall 200A, as shown in FIG. 4B. As such, the length $L_1'$ of the adhesive member 50' in the first direction $D_1$ is shorter than the length $L_2$ of the sidewall 200A in the first direction $D_1$. It should be understood that the elongated adhesive member 50' may increase the cost relative to the dot-shaped adhesive members 50 described above.

Although there is only one semiconductor device 20 in the semiconductor device packages 1 of the above embodiments, more semiconductor devices can also be used in other embodiments. For example, FIG. 5A to FIG. 5G illustrate schematic top views of a semiconductor device package in accordance with some embodiments, which is a multi-chip module (MCM) including at least two different semiconductor devices integrated over the substrate 10. In some embodiments, the semiconductor devices in the package include a first type of semiconductor device 20 and a second type of semiconductor devices 21 to 24. The semiconductor device 20 may be the same as the previously discussed semiconductor device 20, such as an IC die or a package module (e.g., a system-on chip (SoC) die or a system on integrated circuit (SoIC) device that includes two or more dies with integrated functions). Each of the semiconductor devices 21 to 24 may be a memory die, which may include a static random access memory (SRAM) device, a dynamic random access memory (DRAM) device, a high bandwidth memory (HBM) device, or another type of memory device. In some alternative embodiments, the semiconductor device package shown in FIG. 5A to FIG. 5G may also be a chip-on-wafer-on-substrate (CoWoS) package (e.g., the semiconductor devices 20 to 24 are attached to the substrate 10 via an interposer) or another suitable package.

Various arrangements of the adhesive members 50 illustrated in FIG. 1 and FIGS. 3A-3F may also be applied to the semiconductor device package shown in FIG. 5A to FIG. 5G to reduce stress on the adhesive layer $AL_1$ and/or the adhesive layer $AL_2$ (especially for the portions adjacent to the eccentric side of the semiconductor device 20) caused by the components in the package having various CTEs (i.e., various deformations) during thermal cycling, thereby improving the reliability of the package.

In addition, in some embodiments, a width $W_1$ of the ring part 32 farther away from the eccentric semiconductor device 20 may be larger than a width $W_2$ of the ring part 31 closer to the eccentric semiconductor device 20 in order to enhance the structural strength of the ring structure 30, as shown in FIG. 5A to FIG. 5G.

Figure 6:
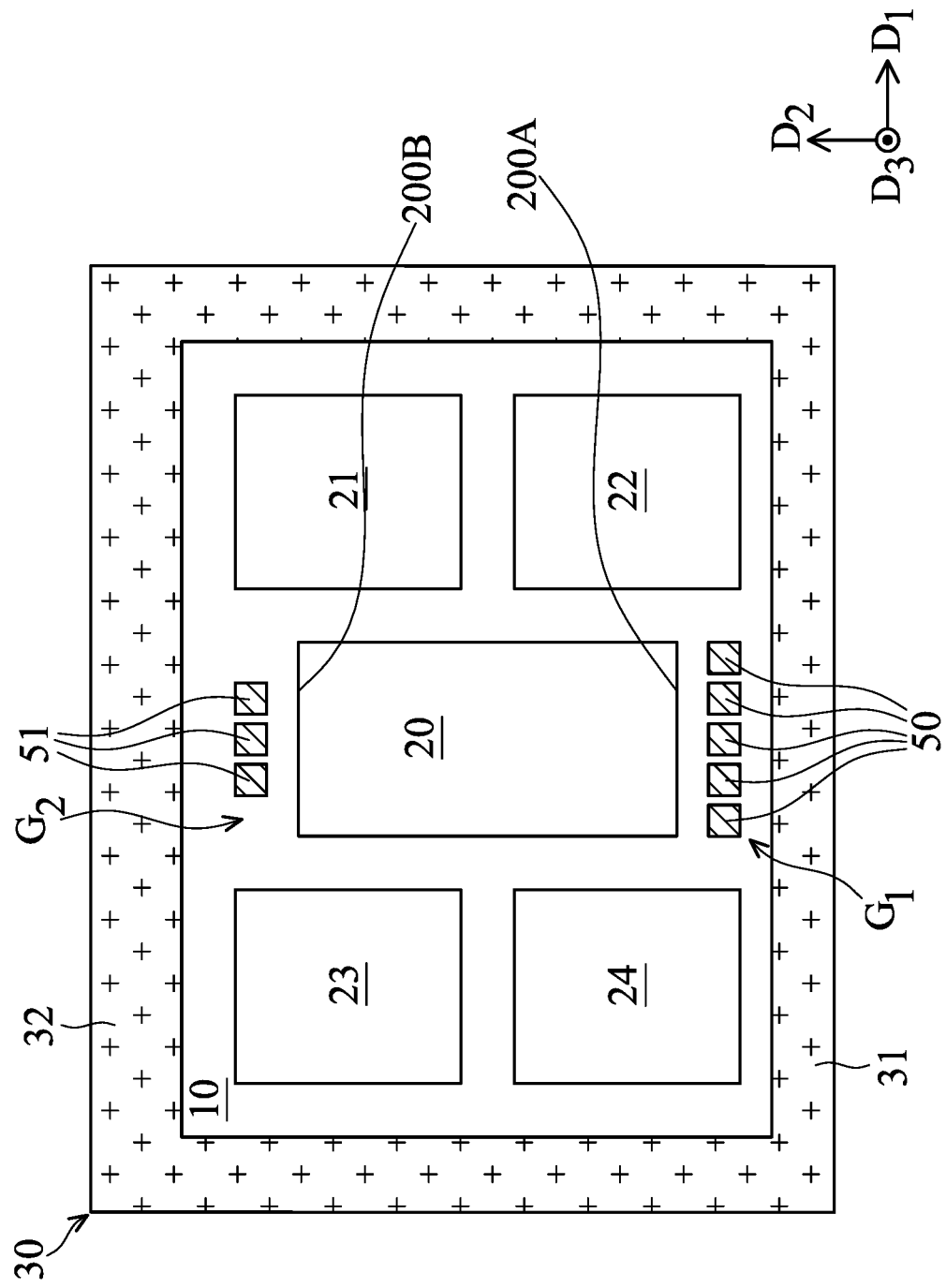
FIG. 6 is a schematic top view illustrating the arrangement of multiple adhesive members, in accordance with some embodiments.

In some other embodiments, additional adhesive members 51 are also provided in the larger gap $G_2$ between the sidewall 200B of the eccentric semiconductor device 20 and the ring part 32 of the ring structure 30, as shown in FIG. 6. The adhesive members 51 may help to further reduce the stress on the adhesive layer $AL_1$ and/or the adhesive layer $AL_2$, for reasons similar to the above adhesive members 50 provided in the smaller gap $G_1$. Due to uneven stress on the adhesive layer $AL_1$ and/or the adhesive layer $AL_2$ caused by the eccentric semiconductor device 20, the number and the combined length (in the first direction $D_1$) of the adhesive members 51 are typically less than those of the adhesive members 50. It should be understood that the greater the combined length of the adhesive members 50/51, the better the stress reduction effect. Therefore, various arrangements of the adhesive members 50 and 51 may be used in different embodiments, and not limited to the arrangements shown in FIG. 6.

Figure 7:
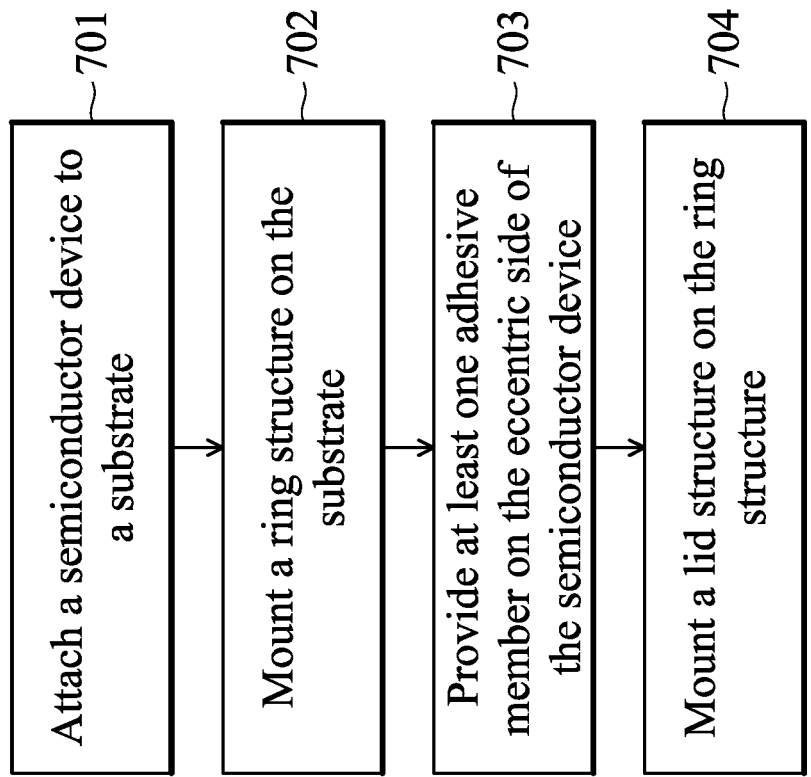
FIG. 7 is a simplified flowchart illustrating a method for forming a semiconductor device package, in accordance with some embodiments.

FIG. 7 is a simplified flowchart illustrating a method 700 for forming a semiconductor device package, in accordance with some embodiments. For illustration, the flowchart will be described along with the drawings shown in FIGS. 1, 2A-2B, 3A-3F, and 4A-4B. Some of the described operations can be replaced or eliminated in different embodiments. Alternatively, some operations may be added in different embodiments.

The method 700 includes operation 701, in which a semiconductor device 20 is attached to a substrate 10, such as by using a pick-and-place tool to place the semiconductor device 20 on a first surface 10A of the substrate 10. Afterwards, electrical connectors 201 between the semiconductor device 20 and the substrate 10 are reflowed to electrically interconnect the semiconductor device 20 with the substrate 10. In some embodiments, considering the spatial arrangement, the semiconductor device 20 is arranged eccentrically with respect to the substrate 10, as shown in FIG. 1 and FIG. 2B.

The method 700 further includes operation 702, in which a ring structure 30 is mounted on the first surface 10A and surrounds the semiconductor device 20 on the substrate 10. In some embodiments, the method 700 further includes applying an adhesive layer $AL_1$ between the ring structure 30 and the first surface 10A for bonding the ring structure 30 to the substrate 10, as previously described. In some embodiments where the semiconductor device 20 is arranged eccentrically with respect to the substrate 10, two gaps $G_1$, $G_2$ with different sizes are formed between the eccentric semiconductor device 20 and the two opposing ring parts 31, 32 of the ring structure 30, respectively.

The method 700 also includes operation 703, in which one or more adhesive members 50/50' are provided in the smaller gap $G_1$ between the eccentric semiconductor device 20 and the adjacent ring part 31 (as shown in FIGS. 1, 3A-3F, and 4A-4B). The adhesive members 50/50' (also referred to as stress reduction members herein) are used to connect the subsequently attached lid structure 40 to the substrate 10 (as well as other components therebetween), which helps to reduce the stress on the adhesive layer $AL_1$ and/or the adhesive layer $AL_2$ caused by the eccentric semiconductor device 20 (as discussed above) in some embodiments. In some embodiments, the adhesive members 50/50' are separated from the semiconductor device 20 and the ring structure 30 to avoid die (device) cracking or other unknown side effects.

The adhesive members 50/50' may include an adhesive material (for example, an organic adhesive material such as epoxy, polyimide (PI), polybenzoxazole (PBO), benzo-cyclo-butene (BCB)), and may be dispensed into the gap $G_1$ using a dispensing tool (not shown) before mounting the lid structure 40 (provided in operation 704) on the top surface 30B of the ring structure 30 (i.e., operation 703). In some embodiments, the adhesive members 50/50', the adhesive layer $AL_1$, and the adhesive layer $AL_2$ are made of or include the same adhesive material, but they may use different materials in other embodiments. The process sequence can be adjusted. For example, operation 703 and operation 704 are interchangeable.

Additionally, the method 700 includes operation 704, in which the lid structure 40 is installed on the top of the ring structure 30 and covers the underlying semiconductor device 20. In some embodiments, the method 700 further includes applying an adhesive layer $AL_2$ between the lid structure 40 and the top surface 30B of the ring structure 30 for bonding the lid structure 40 to the ring structure 30, as previously described. In some embodiments, the adhesive members 50/50' extend from the first surface 10A of the substrate 10 to the bottom surface 40A of the lid structure 40 to couple the lid structure 40 with the substrate 10.

Accordingly, a semiconductor device package with an eccentrically arranged semiconductor device is provided in accordance with some embodiments of the present disclosure. The semiconductor device package has a stress reduction design (for example, by providing one or more adhesive members on the eccentric side of the semiconductor device) to reduce the stress generated on the adhesive layer(s) in the package during thermal cycling and reduce the risk of adhesive delamination. Accordingly, the reliability of the package structure may be improved.

In accordance with some embodiments, a semiconductor device package is provided. The semiconductor device package includes a substrate, a semiconductor device, a ring structure, a lid structure, and an adhesive member. The substrate has a first surface. The semiconductor device is disposed over the first surface. The ring structure is disposed over the first surface and surrounds the semiconductor device. The lid structure is disposed over the top surface of the ring structure and extends across the semiconductor device. The adhesive member is disposed in a gap between the ring structure and the semiconductor device and attached to the lid structure and the first surface of the substrate.

In accordance with some embodiments, a semiconductor device package is provided. The semiconductor device package includes a substrate, a semiconductor device, a ring structure, a lid structure, and a plurality of adhesive members. The substrate has a first surface. The semiconductor device is disposed over the first surface. The ring structure is disposed over the first surface and surrounds the semiconductor device. The lid structure is disposed over the top surface of the ring structure and extends across the semiconductor device. The adhesive members are separated from each other and disposed in a gap between the ring structure and the semiconductor device. Also, the adhesive members extend from the first surface of the substrate to the lid structure to connect the lid structure to the substrate.

In accordance with some embodiments, a method for forming a semiconductor device package is provided. The method includes attaching a semiconductor device to a first surface of a substrate. The method further includes mounting a ring structure on the first surface to surround the semiconductor device. The ring structure includes a first ring part and a second ring part on opposite sides of the semiconductor device. A first gap is formed between the first ring part and the semiconductor device, and a second gap is formed between the second ring part and the semiconductor device. The first gap is smaller than the second gap. The method also includes mounting a lid structure on the top surface of the ring structure to cover the semiconductor device. In addition, the method includes providing at least one adhesive member in the first gap to connect the lid structure to the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device package, comprising:
   a substrate having a first surface;
   a semiconductor device disposed over the first surface;
   a ring structure disposed over the first surface and surrounding the semiconductor device;
   a lid structure disposed over a top surface of the ring structure and extending across the semiconductor device; and
   an adhesive member disposed in a gap between the ring structure and the semiconductor device and attached to the lid structure and the first surface, wherein the adhesive member is separated from the semiconductor device and the ring structure.

2. The semiconductor device package as claimed in claim 1, wherein the ring structure comprises a first ring part and a second ring part on opposite sides of the semiconductor device, a first gap is formed between the first ring part and the semiconductor device, a second gap is formed between the second ring part and the semiconductor device, and the first gap is smaller than the second gap, and
   wherein the semiconductor device has a sidewall facing and parallel to the first ring part, and the adhesive member is disposed in the first gap between the sidewall and the first ring part and extends in a first direction parallel to the sidewall.

3. The semiconductor device package as claimed in claim 2, wherein a length of the adhesive member in the first direction is substantially equal to or shorter than a length of the sidewall of the semiconductor device in the first direction.

4. The semiconductor device package as claimed in claim 1, wherein the ring structure comprises a first ring part and a second ring part on opposite sides of the semiconductor device, a first gap is formed between the first ring part and the semiconductor device, a second gap is formed between the second ring part and the semiconductor device, and the first gap is smaller than the second gap,
   wherein the semiconductor device has a sidewall facing and parallel to the first ring part, and
   wherein the semiconductor device package further comprises a plurality of adhesive members separated from each other, and the adhesive members are disposed in the first gap between the sidewall and the first ring part and arranged in a first direction parallel to the sidewall.

5. The semiconductor device package as claimed in claim 4, wherein the adhesive members are arranged to correspond to a middle area of the sidewall of the semiconductor device.

6. The semiconductor device package as claimed in claim 4, wherein the adhesive members are arranged to correspond to a plurality of corner areas of the sidewall of the semiconductor device.

7. The semiconductor device package as claimed in claim 4, wherein the adhesive members have the same pitch in the first direction.

8. The semiconductor device package as claimed in claim 1, further comprising:
a first adhesive layer interposed between the ring structure and the first surface of the substrate; and
a second adhesive layer interposed between the lid structure and the top surface of the ring structure,
wherein a thickness of the adhesive member in a vertical direction perpendicular to the first surface is substantially equal to a combined thickness of the first adhesive layer, the ring structure and the second adhesive layer in the vertical direction.

9. The semiconductor device package as claimed in claim 1, wherein in a top view, the adhesive member is square, rectangular or circular.

10. The semiconductor device package as claimed in claim 1, wherein the adhesive member is laterally spaced apart from the semiconductor device and laterally spaced apart from the ring structure.

11. A semiconductor device package, comprising:
a substrate having a first surface;
a semiconductor device disposed over the first surface;
a ring structure disposed over the first surface and surrounding the semiconductor device;
a lid structure disposed over a top surface of the ring structure and extending across the semiconductor device; and
a plurality of adhesive members separated from each other and disposed in a gap between the ring structure and the semiconductor device, wherein the adhesive members extend from the first surface of the substrate to the lid structure to connect the lid structure to the substrate.

12. The semiconductor device package as claimed in claim 11, wherein there is a distance greater than 0 μm between each of the adhesive members and the semiconductor device, and there is a distance greater than 0 μm between each of the adhesive members and the ring structure.

13. The semiconductor device package as claimed in claim 11, wherein the ring structure comprises a first ring part and a second ring part on opposite sides of the semiconductor device, a first gap is formed between the first ring part and the semiconductor device, a second gap is formed between the second ring part and the semiconductor device, and the first gap is smaller than the second gap,
wherein the semiconductor device has a sidewall facing and parallel to the ring structure, and
wherein the adhesive members are disposed in the first gap between the sidewall and the first ring part and arranged in a first direction parallel to the sidewall.

14. The semiconductor device package as claimed in claim 13, wherein the adhesive members are arranged to correspond to a middle area and a plurality of corner areas of the sidewall of the semiconductor device.

15. The semiconductor device package as claimed in claim 14, wherein a combined length of the adhesive members in the first direction is substantially equal to or greater than a length of the sidewall of the semiconductor device in the first direction.

16. The semiconductor device package as claimed in claim 11, wherein the adhesive members have two different pitches.

17. A method for forming a semiconductor device package, comprising:
attaching a semiconductor device to a first surface of a substrate;
mounting a ring structure on the first surface to surround the semiconductor device, wherein the ring structure comprises a first ring part and a second ring part on opposite sides of the semiconductor device, a first gap is formed between the first ring part and the semiconductor device, a second gap is formed between the second ring part and the semiconductor device, and the first gap is smaller than the second gap;
mounting a lid structure on a top surface of the ring structure to cover the semiconductor device; and
providing at least one adhesive member in the first gap to connect the lid structure to the substrate.

18. The method as claimed in claim 17, wherein the adhesive member comprises an adhesive material.

19. The method as claimed in claim 17, wherein the adhesive member is provided in such a way that the adhesive member is separated from the semiconductor device and the first ring part.

20. The method as claimed in claim 17, further comprising:
providing a first adhesive layer interposed between the ring structure and the first surface of the substrate; and
providing a second adhesive layer interposed between the lid structure and the top surface of the ring structure,
wherein the first adhesive layer, the second adhesive layer, and the adhesive member comprise the same material.

* * * * *